(12) United States Patent
Wang et al.

(10) Patent No.: US 11,933,416 B2
(45) Date of Patent: Mar. 19, 2024

(54) GATE VALVE DEVICE, CLEANING METHOD AND MECHANICAL APPARATUS

(71) Applicant: CHANGXIN MEMORY TECHNOLOGIES, INC., Hefei (CN)

(72) Inventors: Zhengzheng Wang, Hefei (CN); Liuguang Wang, Hefei (CN); Hongyang Wang, Hefei (CN); Jianqiao Yao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 364 days.

(21) Appl. No.: 17/453,847

(22) Filed: Nov. 6, 2021

(65) Prior Publication Data

US 2023/0015887 A1 Jan. 19, 2023

Related U.S. Application Data

(63) Continuation of application No. PCT/CN2021/109288, filed on Jul. 29, 2021.

(30) Foreign Application Priority Data

Jul. 16, 2021 (CN) .......................... 202110808805.9

(51) Int. Cl.
*F16K 3/30* (2006.01)
*B08B 5/04* (2006.01)
*B08B 13/00* (2006.01)
*F16K 3/02* (2006.01)
*F16K 3/06* (2006.01)

(Continued)

(52) U.S. Cl.
CPC .................. *F16K 3/30* (2013.01); *B08B 1/12* (2024.01); *B08B 1/30* (2024.01); *B08B 5/04* (2013.01); *B08B 13/00* (2013.01); *F16K 3/0254* (2013.01); *F16K 3/06* (2013.01); *F16K 31/44* (2013.01); *H01L 21/67046* (2013.01)

(58) Field of Classification Search
None
See application file for complete search history.

(56) References Cited

U.S. PATENT DOCUMENTS 4,938,250 A * 7/1990 Peterson .............. B65D 90/587
55/432
5,302,120 A * 4/1994 Durado ............. H01L 21/67772
432/247

(Continued)

FOREIGN PATENT DOCUMENTS

CN 100383918 C 4/2008
CN 206301757 U 7/2017

(Continued)

*Primary Examiner* — Umashankar Venkatesan
(74) *Attorney, Agent, or Firm* — Syncoda LLC; Feng Ma

(57) ABSTRACT

A gate valve device includes a cleaning component, a first lifting component, and a second lifting component. The cleaning component is arranged on the second lifting component. The first lifting component is configured to control whether an opening on a side of a vacuum chamber close to a swing gate valve is in a closed state. The second lifting component is configured to, in a case that the opening on the side of the vacuum chamber close to the swing gate valve is in the closed state, control the cleaning component to clean the swing gate valve.

15 Claims, 4 Drawing Sheets

(51) Int. Cl.
    *F16K 31/44*     (2006.01)
    *H01L 21/67*     (2006.01)

(56) References Cited

U.S. PATENT DOCUMENTS

| | | | | |
|---|---|---|---|---|
| 5,837,059 | A * | 11/1998 | Glants | C23C 14/566 |
| | | | | 414/217 |
| 6,103,069 | A | 8/2000 | Davenport | |
| 6,561,484 | B2 * | 5/2003 | Nakagawa | F16K 51/02 |
| | | | | 251/175 |
| 7,637,477 | B2 * | 12/2009 | Hiroki | H01L 21/67126 |
| | | | | 251/163 |
| 8,048,235 | B2 * | 11/2011 | Moriya | H01L 21/67126 |
| | | | | 134/1 |
| 9,121,515 | B2 * | 9/2015 | Yamamoto | H01L 21/67126 |
| 2005/0163599 | A1 * | 7/2005 | Park | H01L 21/67196 |
| | | | | 414/217 |
| 2017/0159830 | A1 * | 6/2017 | Ahn | F16K 3/18 |
| 2021/0080028 | A1 * | 3/2021 | Dsaak | F16K 3/36 |
| 2022/0219397 | A1 * | 7/2022 | Diosdado Borrego | |
| | | | | B08B 5/023 |
| 2023/0094622 | A1 * | 3/2023 | Hiroki | F16K 3/18 |
| | | | | 118/729 |

FOREIGN PATENT DOCUMENTS

| | | | | |
|---|---|---|---|---|
| CN | 107369600 | A | 11/2017 | |
| CN | 108981412 | A | 12/2018 | |
| CN | 210623620 | U | 5/2020 | |
| CN | 111326385 | A | 6/2020 | |
| JP | 2002334863 | A | 11/2002 | |
| KR | 20210126460 | A * | 10/2021 | ........... F16K 3/0281 |
| KR | 20210126461 | A * | 10/2021 | ........... F16K 3/0281 |
| KR | 20210127053 | A * | 10/2021 | ....... H01L 21/67167 |

\* cited by examiner

GATE VALVE DEVICE, CLEANING METHOD AND MECHANICAL APPARATUS

CROSS-REFERENCE TO RELATED APPLICATIONS

This is a continuation of International Patent Application No. PCT/CN2021/109288, filed on Jul. 29, 2021, which claims priority to Chinese Patent Application No. 202110808805.9, filed on Jul. 16, 2021. The disclosures of these applications are incorporated by reference herein in their entirety.

BACKGROUND

In a manufacturing process of a semiconductor memory, various process treatments need to be performed on a wafer by using a semiconductor etching machine. Since most of the process treatments need to be performed in a vacuum environment, the semiconductor etching machine includes a vacuum chamber and a process chamber, and the vacuum chamber and the process chamber are separated from each other by a swing gate valve.

SUMMARY

The present disclosure relates, but is not limited, to a gate valve device, a cleaning method and a mechanical apparatus.

In a first aspect, an embodiment of the present disclosure provides a gate valve device. The gate valve device is installed in a mechanical apparatus including a vacuum chamber and a process chamber. A swing gate valve is provided between the vacuum chamber and the process chamber. The gate valve device is arranged at an opening on a side of the vacuum chamber close to the swing gate valve.

The gate valve device includes a cleaning component, a first lifting component and a second lifting component. The cleaning component is arranged on the second lifting component.

The first lifting component is configured to control whether the opening on the side of the vacuum chamber close to the swing gate valve is in a closed state.

The second lifting component is configured to, in a case that the opening on the side of the vacuum chamber close to the swing gate valve is in the closed state, control the cleaning component to clean the swing gate valve.

In a second aspect, an embodiment of the present disclosure provides a cleaning method for a gate valve device. The gate valve device is installed in a mechanical apparatus including a vacuum chamber and a process chamber. A swing gate valve is provided between the vacuum chamber and the process chamber. The gate valve device is arranged at an opening on a side of the vacuum chamber close to the swing gate valve. The gate valve device includes a cleaning component, a first lifting component and a second lifting component. The cleaning component is arranged on the second lifting component. The method includes the following operations.

Through the first lifting component, the opening on the side of the vacuum chamber close to the swing gate valve is controlled to be in a closed state.

Through the second lifting component, the cleaning component is controlled to clean the swing gate valve.

In a third aspect, an embodiment of the present disclosure provides a mechanical apparatus. The mechanical apparatus includes a vacuum chamber, a process chamber, a swing gate valve, and a gate valve device. The gate valve device is installed in the mechanical apparatus. The swing gate valve is provided between the vacuum chamber and the process chamber. The gate valve device is arranged at an opening on a side of the vacuum chamber close to the swing gate valve.

The gate valve device includes a cleaning component, a first lifting component and a second lifting component. The cleaning component is arranged on the second lifting component.

The first lifting component is configured to control whether the opening on the side of the vacuum chamber close to the swing gate valve is in a closed state.

The second lifting component is configured to, in a case that the opening on the side of the vacuum chamber close to the swing gate valve is in the closed state, control the cleaning component to clean the swing gate valve.

DETAILED DESCRIPTION

The technical solutions in the embodiments of the present disclosure are clearly and completely described below in combination with the accompanying drawings in the embodiments of the present disclosure. It can be understood that the specific embodiments described here are merely to explain the related disclosure, but not intended to limit the present disclosure. In addition, it should be noted that for ease of description, only parts related to the related disclosure are illustrated in the accompanying drawings.

Unless defined otherwise, all technical and scientific terms used herein have the same meaning as commonly understood by those skilled in the art to which the present disclosure belongs. The terminology used herein is for a purpose of describing the embodiments of the present disclosure only, and is not intended to limit the present disclosure.

In the following description, the expression "some embodiments" is involved, which describes subsets of all possible embodiments. However, it should be understood that, "some embodiments" may be same subsets or different subsets of all possible embodiments, and may be combined with each other without conflict.

It should be pointed out that terms "first\second\third" involved in the embodiments of the present disclosure may only be used to distinguish similar objects, without indicating any specific ordering for objects. Understandably, "first\second\third" may be exchanged in a specific order or sequence where it is permitted, such that the embodiments of the present disclosure described herein may be implemented in an order other than those illustrated or described herein.

In a manufacturing process of a semiconductor memory, various process treatments need to be performed on a wafer by using a semiconductor etching machine. Since most of the process treatments need to be performed in a vacuum atmosphere, the semiconductor etching machine includes a vacuum chamber and a process chamber, and the vacuum chamber and the process chamber are separated from each other by a swing gate valve.

A small door panel on a side of the swing gate valve close to the vacuum chamber abuts against a sidewall of the vacuum chamber. If the small door panel needs to be cleaned, the whole semiconductor etching machine has to be stopped, and then the small door panel has to be removed and cleaned separately, which brings great inconvenience to the production process, and reduces the production efficiency of the semiconductor etching machine.

Figure 1:
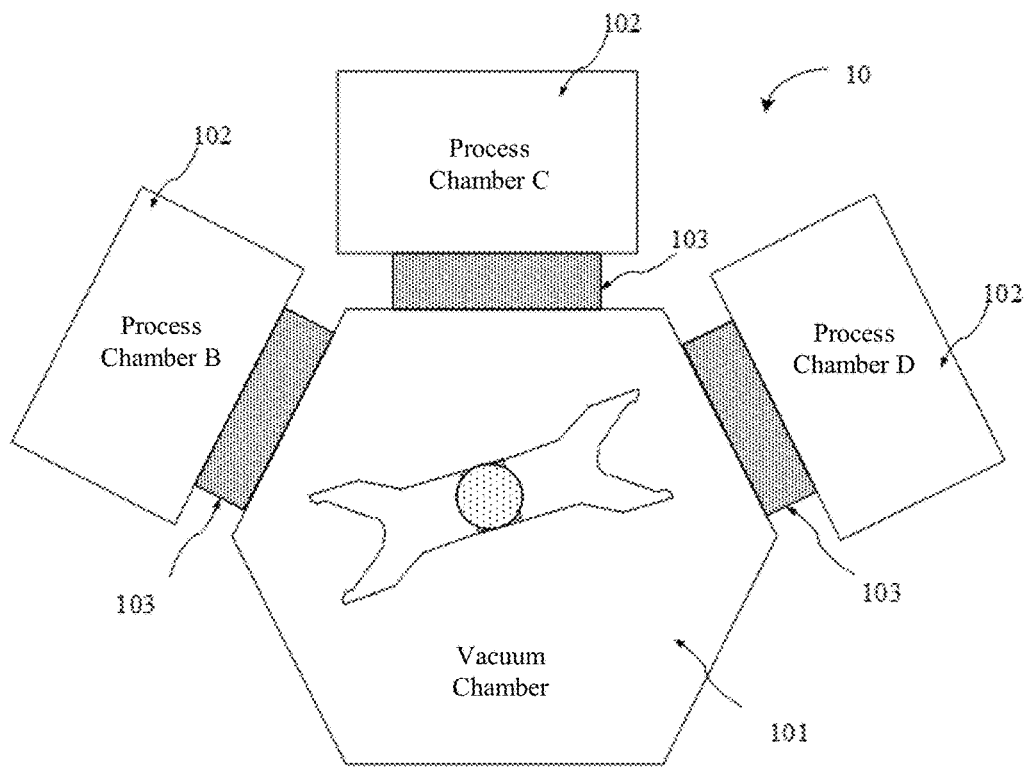
FIG. 1 is a schematic diagram of a semiconductor etching machine in some implementations.

Referring to FIG. 1, a schematic diagram of a semiconductor etching machine in some implementations is shown. As shown in FIG. 1, the semiconductor etching machine 10 includes a vacuum chamber 101 and a plurality of process chambers 102, such as a process chamber B, a process chamber C and a process chamber D shown in FIG. 1. Each process chamber 102 is connected to the vacuum chamber 101 through a swing gate valve 103.

Figure 2:
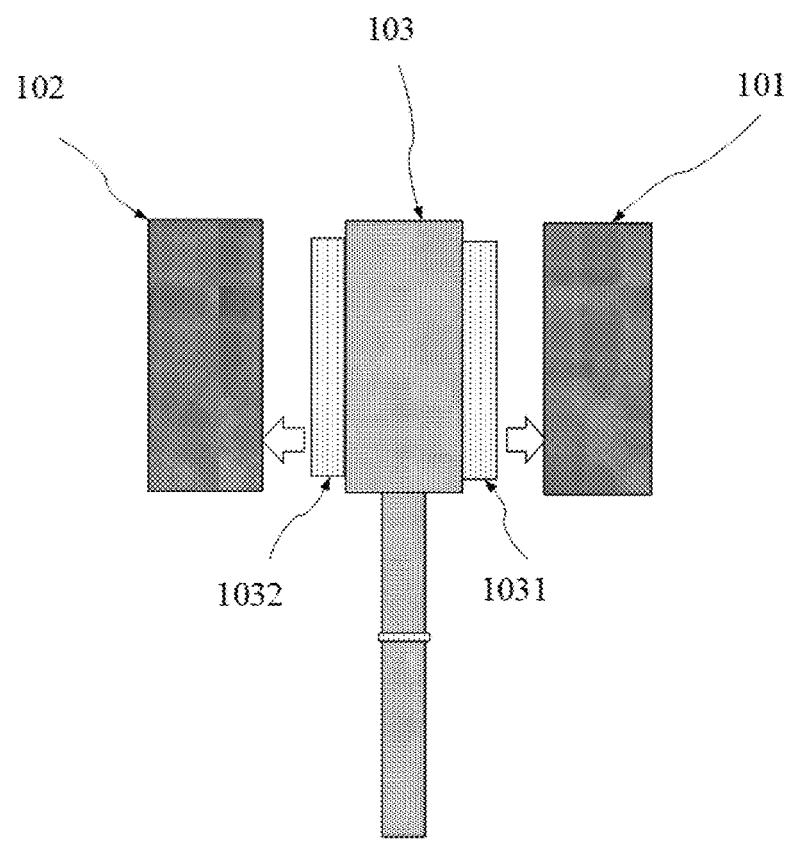
FIG. 2 is a partial schematic diagram of a semiconductor etching machine in some implementations.

Referring to FIG. 2, a partial schematic diagram of a semiconductor etching machine in some implementations is shown. As shown in FIG. 2, during the maintenance of the chambers, a small door panel 1032 close to the process chamber 102 (also referred to as Chamber) may be easily cleaned, while a small door panel 1031 close to the vacuum chamber 101 (also referred to as VTM) abuts against a sidewall of the VTM, so that the small door panel 1031 may not be cleaned. If the small door panel 1031 has to be cleaned, the whole machine has to be stopped to remove the small door panel 1031.

However, in some implementations, a method of cleaning by removing the small door panel is very inconvenient. Moreover, if the downtime is too much, the yield of the semiconductor etching machine may be significantly reduced. However, if the small door panel close to the vacuum chamber is not cleaned for a long time, it may also have an impact on the quality of the product, especially for those products that require a high degree of cleanliness.

Based on this, an embodiment of the present disclosure provides a gate valve device. The basic concept is as follows. The gate valve device is installed in a mechanical apparatus including a vacuum chamber and a process chamber. A swing gate valve is provided between the vacuum chamber and the process chamber. The gate valve device is arranged at an opening on a side of the vacuum chamber close to the swing gate valve. The gate valve device includes a cleaning component, a first lifting component and a second lifting component. The cleaning component is arranged on the second lifting component. The first lifting component is configured to control whether the opening on the side of the vacuum chamber close to the swing gate valve is in a closed state. The second lifting component is configured to, in a case that the opening on the side of the vacuum chamber close to the swing gate valve is in the closed state, control the cleaning component to clean the swing gate valve. In this way, the vacuum on the side of the vacuum chamber may be isolated by the first lifting component, so that the swing gate valve may be cleaned during the operation of the apparatus, thereby avoiding the apparatus from being damaged due to frequent downtime. The swing gate valve may be automatically cleaned through the second lifting component without being removed, so that the cleaning efficiency is improved. In addition, since the swing gate valve may be conveniently cleaned through the gate valve device, the cleanliness of the product is improved, thereby improving the operating efficiency of the overall apparatus.

Hereinafter, each embodiment of the present disclosure is described in detail with reference to the accompanying drawings.

Figure 3:
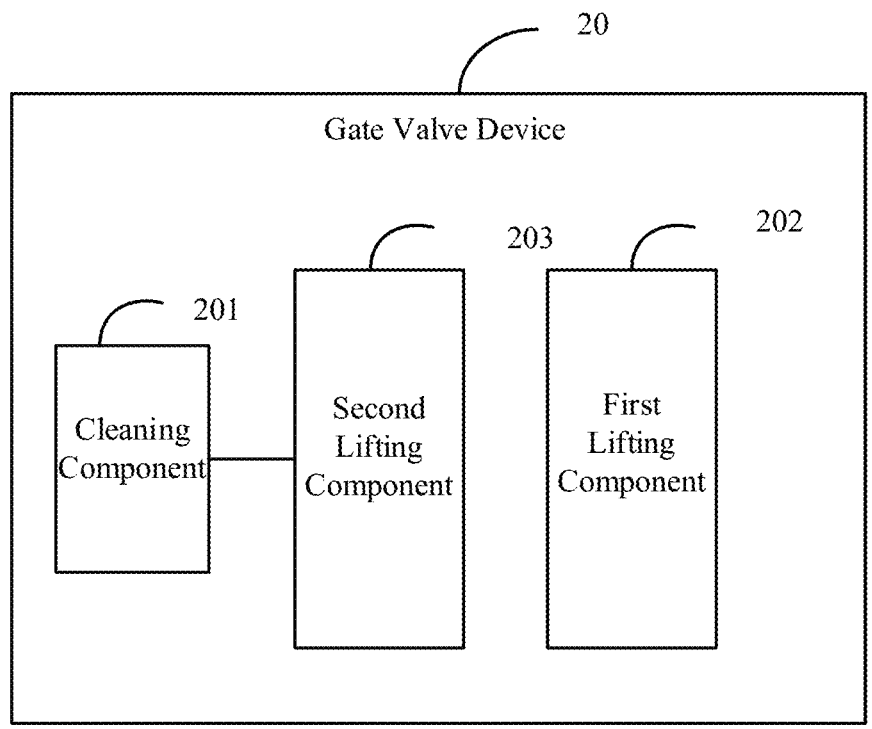
FIG. 3 is a schematic diagram of a gate valve device according to an embodiment of the present disclosure.

In an embodiment of the present disclosure, referring to FIG. 3, a schematic diagram of a gate valve device 20 according to an embodiment of the present disclosure is shown. As shown in FIG. 3, the gate valve device 20 is installed in a mechanical apparatus including a vacuum chamber and a process chamber. A swing gate valve is provided between the vacuum chamber and the process chamber. The gate valve device is arranged at an opening on a side of the vacuum chamber close to the swing gate valve.

The gate valve device 20 includes a cleaning component 201, a first lifting component 202 and a second lifting component 203. The cleaning component 201 is arranged on the second lifting component 203.

The first lifting component 202 is configured to control whether the opening on the side of the vacuum chamber close to the swing gate valve is in a closed state.

The second lifting component 203 is configured to, in a case that the opening on the side of the vacuum chamber close to the swing gate valve is in the closed state, control the cleaning component 201 to clean the swing gate valve.

It should be noted that the gate valve device 20 provided in the embodiment of the present disclosure is applied to a mechanical apparatus, and the mechanical apparatus may be, for example, a semiconductor etching machine. As shown in FIG. 1 and FIG. 2, the mechanical apparatus includes the vacuum chamber 101 and the process chamber 102. The interior of the vacuum chamber 101 is in a vacuum state, and the process chamber 102 is a chamber in which an etching reaction occurs. The swing gate valve 103 is provided between the vacuum chamber 101 and the process chamber 102, and is configured to control whether the vacuum chamber 101 is communicated with the process chamber 102.

Figure 4A:
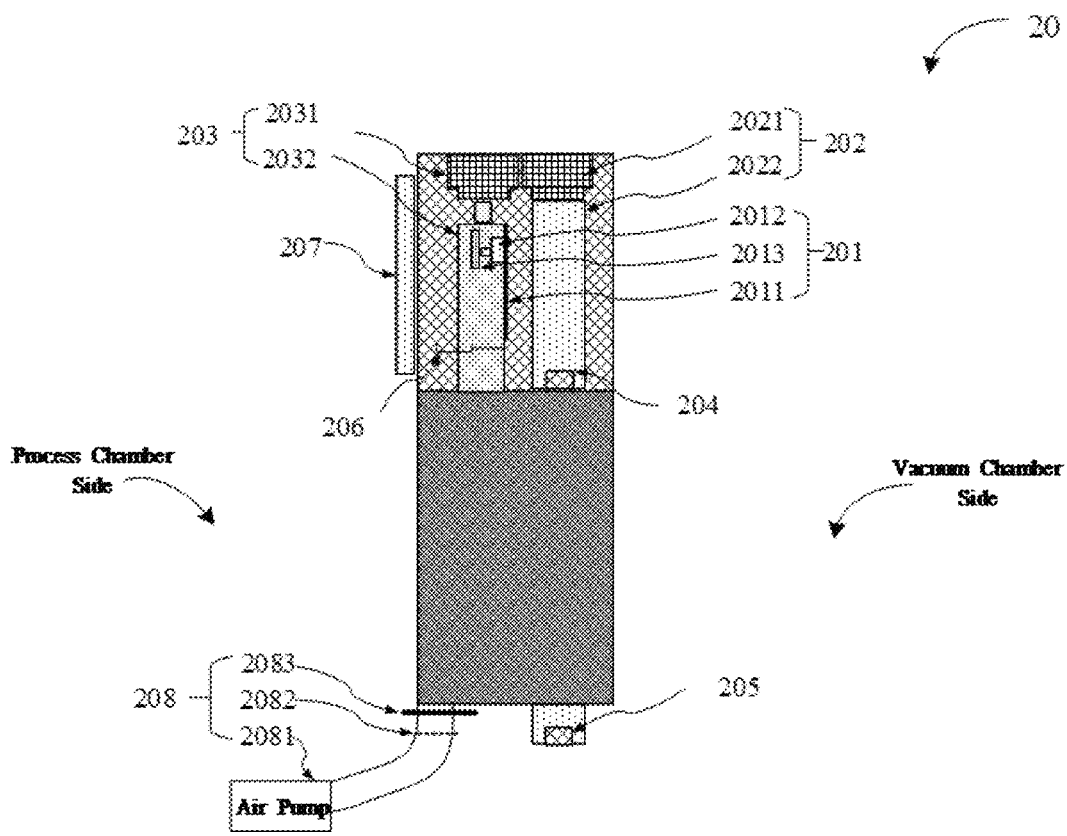
FIG. 4A is a side view of a gate valve device according to an embodiment of the present disclosure.
Figure 4B:
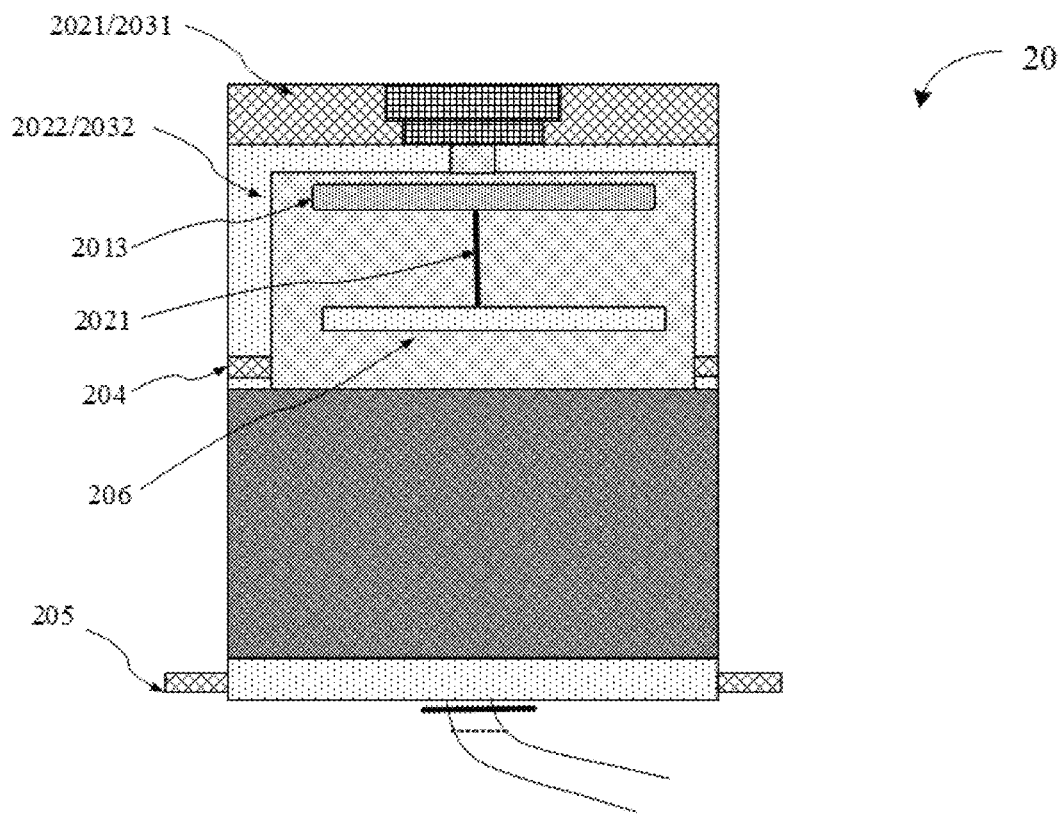
FIG. 4B is a front view of a gate valve device according to an embodiment of the present disclosure.

Based on this, referring to FIG. 4A, a side view of a gate valve device according to an embodiment of the present disclosure is shown. Referring to FIG. 4B, a front view of a gate valve device according to an embodiment of the present disclosure is shown. As shown in FIG. 4A and FIG. 4B, the gate valve device 20 is arranged at an opening on a side of the vacuum chamber close to the swing gate valve. Specifically, the gate valve device 20 includes a first lifting component 202 and a second lifting component 203. The second lifting component 203 is provided with a cleaning component 201. When the gate valve device 20 is in operation, the first lifting component 202 can be lowered to control the opening on the side of the vacuum chamber close to the swing gate valve to be in the closed state, so that the vacuum on the side of the vacuum chamber is isolated. Then the second lifting component 203 controls the cleaning component 201 to clean the swing gate valve. It should be understood that in other embodiments, the first lifting component 202 may also be lifted to isolate the vacuum on the side of the vacuum chamber.

In this way, during the operation of the mechanical apparatus, although the vacuum chamber is always in a vacuum state, since the first lifting component 202 may isolate the vacuum on the side of the vacuum chamber, the second lifting component 203 may control the cleaning component 201 to clean the door panel of the swing gate valve on the side close to the vacuum chamber. In this way, the swing gate valve may be conveniently cleaned during the operation of the mechanical apparatus without stopping the mechanical apparatus to remove the swing gate valve, thereby avoiding the mechanical apparatus from being damaged due to frequent downtime. Meanwhile, the cleanliness of the product is improved, and the production efficiency is improved.

The first lifting component 202 and the second lifting component 203 may adopt power elements of various principles. Hereinafter, only a retractable rod is specifically described.

Referring to FIG. 4A, in some embodiments, the first lifting component 202 includes a first retractable rod 2021 and a first lifting valve body 2022. The first retractable rod 2021 is configured to drive the first lifting valve body 2022 to slide between a first vertical height and a second vertical height.

The first lifting component 202 is specifically configured to, in a case that the first lifting valve body 2022 slides to the first vertical height, control the opening on the side of the vacuum chamber close to the swing gate valve to be in an opened state. Alternatively, the first lifting component 202 is specifically configured to, in a case that the first lifting valve body slides to the second vertical height, control the opening on the side of the vacuum chamber close to the swing gate valve to be in the closed state.

It should be noted that the first lifting component 202 may be in the form of a retractable valve. Therefore, the first lifting component 202 includes the first retractable rod 2021 and the first lifting valve body 2022. The first retractable rod 2021 is a power element, such as a hydraulic element, a pneumatic element, etc. The first retractable rod 2021 may drive the first lifting valve body 2022 to slide between the first vertical height and the second vertical height.

When the first lifting valve body 2022 is at the first vertical height, the opening on the side of the vacuum chamber close to the swing gate valve is in the opened state. When the second lifting valve body 2032 is at the second vertical height, the opening on the side of the vacuum chamber close to the swing gate valve is completely closed through the second lifting valve body 2032, thereby isolating the vacuum on the side of the vacuum chamber.

Herein, the first vertical height may be higher than the second vertical height, or the first vertical height may be lower than the second vertical height. In other words, for the mechanical apparatus, it is necessary to separately provide a space higher or lower than the swing gate valve for the gate valve device 20, so that the first lifting valve body 2022 is accommodated without closing the opening on the side of the vacuum chamber close to the swing gate valve.

Further, in some embodiments, the gate valve device 20 further includes a safety pin 204 and a safety slot 205. The safety pin 204 is arranged on the first lifting valve body 2022, and the safety slot 205 is arranged at a bottom portion of the gate valve device 20.

The safety pin 204 is configured to, when the first lifting valve body 2022 slides to the second vertical height, be inserted into the safety slot 205 to lock the first lifting valve body 2022.

It should be noted that, in order to improve the safety, a locking mechanism may further be provided for the first lifting valve body 2022. Taking the first vertical height higher than the second vertical height as an example, in this case, the first lifting valve body 2022 needs to be lowered to close the opening on the side of the vacuum chamber close to the swing gate valve. In this case, the safety pin 204 may be provided on the first lifting valve body 2022, meanwhile, the safety slot 205 may be provided at the bottom portion of the component opposite to the first lifting valve body 2022, so that after the first lifting valve body 2022 is lowered, the safety pin 204 may be inserted into the safety slot 205 to achieve locking, thereby avoiding the first lifting valve body 2022 from lifting due to an external force or other reasons to damage the apparatus.

It should be understood that the safety pin 204 may also be additionally connected to a small retractable rod, so as to automatically control the locking and unlocking between the safety pin 204 and the safety slot 205.

Similarly, the second lifting component 203 includes a second retractable rod 2031 and a second lifting valve body 2032. The cleaning component 201 is arranged on the second lifting valve body 2032.

The second retractable rod 2031 is configured to drive the second lifting valve body 2032 to slide from the first vertical height to the second vertical height, so that the cleaning component 201 and the swing gate valve are in a same height range.

It should be noted that the second lifting component 203 includes the second retractable rod 2031 and the second lifting valve body 2032. The cleaning component 201 is arranged on the second lifting valve body 2032.

Herein, the second retractable rod 2031 and the first retractable rod 2021 may be power elements of the same principle, or may be power elements of different principles. The second retractable rod 2031 is configured to drive the second lifting valve body 2032 to slide from the first vertical height to the second vertical height, so that the cleaning component 201 and the swing gate valve are in the same height range.

In other words, in a non-operating state of the gate valve device 20, the first lifting valve body 2022 and the second lifting valve body 2032 are actually hidden in an enclosed space higher than the swing gate valve/lower than the swing gate valve, so that the communication/isolation state between the vacuum chamber and the process chamber may not be affected. Specifically, the space may be set as a sealed space. For example, an inversion door is provided at the bottom/top of the sealed space. When it is necessary to perform cleaning, the inversion door is opened, the first lifting valve body is firstly lowered/lifted to isolate the vacuum on the side of the vacuum chamber, and the second lifting valve body 2032 is then lowered/lifted, so that the cleaning component 201 is controlled to be at the same height as the swing gate valve to be cleaned, thereby facilitating the subsequent cleaning. After the cleaning is completed, the first lifting valve body 2022 and the second lifting valve body 2032 are controlled to return to the sealed space, so that the gate valve device 20 is prevented from affecting the normal operation of the semiconductor etching machine.

Specifically, the first lifting valve body 2022 and the second lifting valve body 2032 may slide in opposite directions. Illustratively, the first lifting valve body 2022 is hidden in the enclosed space higher than the swing gate valve, and the second lifting valve body 2032 is hidden in the enclosed space lower than the swing gate valve. In use, the first lifting valve body 2022 needs to be lowered, while the second lifting valve body 2032 needs to be lifted.

Further, in some embodiments, the cleaning component 201 includes a sliding slot 2011, a micro pushing member 2012 and a dirt removing component 2013. The sliding slot 2011 is arranged on the second lifting valve body 2032. One end of the micro pushing member 2012 is arranged on the sliding slot 2011, and another end of the micro pushing member 2012 is provided with the dirt removing component 2013.

The micro pushing member 2012 is configured to control the dirt removing component 2013 to be moved along a horizontal direction, so that the dirt removing component 2013 contacts the swing gate valve.

The sliding slot 2011 is configured to, in a case that the cleaning component 201 contacts the swing gate valve, control the dirt removing component 2013 to be moved along a vertical direction, so as to clean the swing gate valve.

It should be noted that, as shown in FIG. 4A and FIG. 4B, the cleaning component 201 may include the sliding slot 2011, the micro pushing member 2012 and the dirt removing component 2013. Before the cleaning process starts, in the horizontal direction, the dirt removing component 2013 and the swing gate valve are not in the same horizontal position, which may reduce the resistance of the second lifting component 203 when it is lowered, while increasing the service life of the dirt removing component 2013.

After the cleaning component 201 and the swing gate valve are at the same height, the micro pushing member 2012 drives the dirt removing component 2013 to be moved along the horizontal direction, until the dirt removing component 2013 contacts a surface on a side of the swing gate valve close to the vacuum chamber, namely the small door panel 1031 shown in FIG. 2. Then the sliding slot 2011 drives the dirt removing component 2013 to be moved along the vertical direction, so as to clean the swing gate valve.

It should also be noted that the dirt removing component 2013 may be a hard sponge.

Further, the cleaning component 201 further includes a retractable carrier plate 206. The retractable carrier plate 206 is arranged on the second lifting valve body 2032, and the retractable carrier plate 206 is located below the dirt removing component 2013.

The retractable carrier plate 206 is configured to accommodate a part of dirt generated in a process of cleaning the swing gate valve by the cleaning component 201.

It should be noted that some dirt debris may be generated when the small door panel is cleaned by the dirt removing component 2013. In order to avoid the contamination of the overall mechanical apparatus, a retractable carrier plate 206 may be provided below the dirt removing component 2013, so as to accommodate the dirt. Herein, the retractable carrier plate 206 may be set to be in cooperation with the dirt removing component 2013, or to be independently controlled.

Further, in some embodiments, the gate valve device 20 further includes a door 207.

The second retractable rod 2031 is further configured to drive the second lifting valve body 2032 to slide from the second vertical height to the first vertical height.

The door 207 is configured to, in a case that the second lifting component 203 slides to the first vertical height, expose the dirt removing component 2013 and the retractable carrier plate 206.

It should be noted that after the cleaning process is completed, the second retractable rod 2031 may also drive the second lifting valve body 2032 to slide from the second vertical height to the first vertical height. That is, the second lifting valve body 2032 is returned to a storage space higher/lower than the swing gate valve. The storage space is provided with a door 207, through which the dirt removing component 2013 and the retractable carrier plate 206 may be exposed, so that the dirt removing component 2013 may be replaced and the retractable carrier plate 206 may be cleaned, thereby improving the efficiency of subsequent cleaning. Then the door 207 is closed, and the first retractable rod 2021 slides from the second vertical height to the first vertical height, so that the communication between the vacuum chamber and the swing gate valve is restored, and this cleaning process is completed.

Further, in some embodiments, the gate valve device 20 further includes an air pump component 208.

The air pump component 208 is configured to extract a part of dirt generated in a process of cleaning the swing gate valve by the cleaning component 201.

The air pump component 208 includes an air pump 2081, a switch valve 2082 and a filter screen 2083. The air pump 2081 is connected to a closed chamber through a pipe. The switch valve 2082 and the filter screen 2083 are arranged at one end of the pipe close to the closed chamber. The closed chamber is a chamber formed between the first lifting component 202 and the swing gate valve in the case that the opening on the side of the vacuum chamber close to the swing gate valve is in the closed state.

It should be noted that, as shown in FIG. 4A and FIG. 4B, the gate valve device 20 further includes the air pump component 208. During the cleaning of the gate valve device 20, a closed chamber is actually formed between the gate valve device 20 and the swing gate valve. The air pump component 208 may extract the dirt in the closed chamber, so that most of the removed dirt may be extracted out of the closed chamber, and a small part of the removed dirt may fall into the retractable carrier plate 206.

The air pump component 208 includes the air pump 2081, the switch valve 2082 and the filter screen 2083. The filter screen 2083 is configured to prevent large particles of dirt from blocking the air pump component. The switch valve 2082 is configured to control whether the air pump is communicated with the closed chamber, so as to avoid the vacuum state of the vacuum chamber from affecting the air pump 2081 in the non-operating state of the gate valve device 20. Herein, the air pump 2081 includes various types of pumps, such as a dry pump.

Further, in some embodiments, the force of the micro pushing member 2012 is less than or equal to a first threshold, and the signal response time of each of the first lifting component 202 and the second lifting component 203 is less than or equal to a second threshold.

It should be noted that the force of the micro pushing member 2012 is less than or equal to the first threshold, preferably 2 Newtons.

The gate valve device 20 may be designed to be manual controlled or controlled by signal. If the gate valve device 20 is controlled by signal, in one embodiment, the first lifting component 202, the second lifting component 203, the micro pushing member 2012, the sliding slot 2011, the retractable carrier plate 206, the air pump 2081, the safety pin 204 and the like may be all set to be electric. Considering the efficiency of the cleaning process, the signal response time of these components must be less than or equal to the second threshold, preferably 1 second.

The dirt removing component 2013 needs to be selected that is not easy to be damaged, such as a sponge, a steel wire, and a brush, preferably a hard sponge. On the premise that it is not easy to be damaged, the hard sponge has good cleaning capability, low cost, and may not damage the small door panel.

Specifically, according to actual application scenarios, the above components may be replaced with other components with the similar functions, or other components may be added on the basis of above components, such as a cleanser storage component, a cleanser spraying component, and a distilled water tank.

Overall, in a transfer area (i.e., an area between the process chamber and the vacuum chamber) of the semiconductor etching machine in some implementations, the swing gate valve close to the vacuum chamber is not easy to be cleaned. It is necessary to stop the whole apparatus to remove the swing gate valve, so that the swing gate valve close to the vacuum chamber may not be cleaned during the maintenance of the ordinary machine. Moreover, deposits may be generated on the swing gate valve close to the vacuum chamber if the swing gate valve is not cleaned for a long time, so that the yield of the product may be finally affected. In the embodiment of the present disclosure, a new door panel (i.e., a gate valve device) is added on a side of the vacuum chamber, so that the swing gate valve may be cleaned without removing the swing gate valve during the maintenance of the machine, and the door panel may be conveniently cleaned during the maintenance of the machine, thereby increasing the yield of the product.

Specifically, the gate valve device is more flexible. The operator may lower the first retractable rod in the gate valve device to the bottom during the maintenance of the chamber, until the safety pin of the first retractable rod is inserted into the safety pin slot through an internal small retractable rod, so as to achieve the secondary locking. Then after the action of the first retractable rod is completed, the second retractable rod drives the cleaning component to automatically clean the side of the swing gate valve close to the vacuum chamber. In this way, there is no need to shut down the whole machine to clean the swing gate valve, but the swing gate valve may be cleaned during the maintenance of the chamber. The gate valve device is an independent micro system with strong independence, so that the gate valve device may be cleaned and maintained at any time. The gate valve device does not need to be cleaned during the maintenance of the chamber or the whole machine.

The embodiments of the present disclosure provide a gate valve device, a cleaning method and a mechanical apparatus. The gate valve device is installed in the mechanical apparatus including a vacuum chamber and a process chamber. A swing gate valve is provided between the vacuum chamber and the process chamber. The gate valve device is arranged at an opening on a side of the vacuum chamber close to the swing gate valve. The gate valve device includes a cleaning component, a first lifting component and a second lifting component. The cleaning component is arranged on the second lifting component. The first lifting component is configured to control whether the opening on the side of the vacuum chamber close to the swing gate valve is in a closed state. The second lifting component is configured to, in a case that the opening on the side of the vacuum chamber close to the swing gate valve is in the closed state, control the cleaning component to clean the swing gate valve. In this way, the vacuum on the side of the vacuum chamber may be isolated by the first lifting component, so that the swing gate valve may be cleaned during the operation of the apparatus, thereby avoiding the apparatus from being damaged due to frequent downtime. The swing gate valve may be automatically cleaned through the second lifting component without being removed, so that the cleaning efficiency is improved. In addition, since the swing gate valve may be conveniently cleaned through the gate valve device, the cleanliness of the product is improved, thereby improving the operation efficiency of the overall apparatus.

Figure 5:
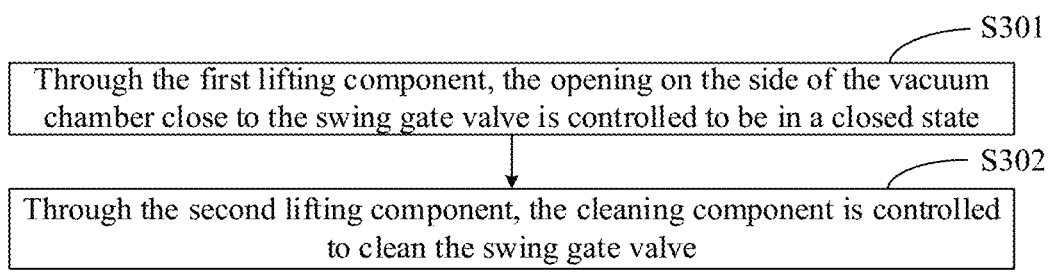
FIG. 5 is a schematic diagram of a cleaning method according to an embodiment of the present disclosure.

In another embodiment of the present disclosure, referring to FIG. 5, a schematic diagram of a cleaning method according to an embodiment of the present disclosure is shown. As shown in FIG. 5, the cleaning method may include the following operations.

In S301, through the first lifting component, the opening on the side of the vacuum chamber close to the swing gate valve is controlled to be in a closed state.

In S302, through the second lifting component, the cleaning component is controlled to clean the swing gate valve.

It should be noted that the cleaning method provided by the embodiment of the present disclosure is applied to a semiconductor etching machine.

In some implementations, the semiconductor etching machine includes a process chamber and a vacuum chamber, and a swing gate valve is provided between the process chamber and the vacuum chamber. When a surface on a side of the swing gate valve close to the vacuum chamber is cleaned, it is necessary to stop the whole semiconductor etching machine, and then the swing gate valve is removed, so that the complexity is relatively high.

In the embodiment of the present disclosure, a gate valve device is added in the semiconductor etching machine, so that the surface on the side of the swing gate valve close to the vacuum chamber is conveniently clean through the gate valve device. In other words, the cleaning method provided by the embodiment of the present disclosure is applied to the gate valve device. The gate valve device is installed in the mechanical apparatus including the vacuum chamber and the process chamber. The swing gate valve is provided between the vacuum chamber and the process chamber. The gate valve device is arranged at the opening on the side of the vacuum chamber close to the swing gate valve. The gate valve device includes a cleaning component, a first lifting component and a second lifting component. The cleaning component is arranged on the second lifting component.

Based on such a structure, when cleaning is performed, firstly, through the first lifting component, the opening on the side of the vacuum chamber close to the swing gate valve is controlled to be in the closed state, so as to isolate a vacuum environment on the side of the vacuum chamber. Secondly, through the second lifting component, the cleaning component is controlled to clean the swing gate valve. In this way, it is not necessary to stop the whole semiconductor etching machine, and the gate valve device may be used to clean the swing gate valve at random, which is simple and convenient, thereby avoiding affecting the cleanliness of the product.

It should also be noted that the first lifting component and the second lifting component may adopt power elements of various principles. Hereinafter, a retractable rod is only described.

In some embodiments, the first lifting component includes a first retractable rod and a first lifting valve body. Correspondingly, the operation that through the first lifting component, the opening on the side of the vacuum chamber close to the swing gate valve is controlled to be in the closed state may include the following operation.

The first lifting valve body is driven to slide from a first vertical height to a second vertical height by the first retractable rod, so as to control the opening on the side of the vacuum chamber close to the swing gate valve to be in the closed state.

It should be noted that the first lifting component is composed of the first retractable rod and the first lifting valve body. The first retractable rod may drive the first lifting valve body to slide from the first vertical height to the second vertical height, so that the vacuum on the side of the vacuum chamber is isolated. The first retractable rod may be a pneumatic component, a hydraulic component and the like. The first vertical height may be lower than the second vertical height. Alternatively, the first vertical height may also be higher than the second vertical height.

Further, in order to better isolate the vacuum on the side of the vacuum chamber, a locking mechanism may be additionally provided, so as to guarantee that the first lifting component may not accidentally slide when the vacuum on the side of the vacuum chamber is isolated. Therefore, in some embodiments, the gate valve device further includes a safety pin and a safety slot. The cleaning method may further include the following operation.

When the first lifting valve body is driven to slide from the first vertical height to the second vertical height by the first retractable rod, the safety pin is inserted into the safety slot, so as to lock the first lifting valve body.

It should be noted that when the first lifting valve body slides from the first vertical height to the second vertical height, the safety pin is inserted into the safety slot, so as to lock the first lifting valve body.

Further, the second lifting component includes a second retractable rod and a second lifting valve body. The cleaning component includes a dirt removing component, a sliding slot and a micro pushing member. Therefore, in some embodiments, the operation that through the second lifting component, the cleaning component is controlled to clean the swing gate valve may include the following operations.

The second lifting valve body is driven to slide from the first vertical height to the second vertical height by the second retractable rod, so that the cleaning component and the swing gate valve are in the same height range.

The dirt removing component is controlled to be moved along a horizontal direction through the micro pushing member, until the dirt removing component contacts the swing gate valve.

The dirt removing component is controlled to be moved along a vertical direction through the sliding slot, so as to clean the swing gate valve.

It should be noted that after the vacuum on the side of the vacuum chamber is isolated by the first lifting component, the second lifting valve body is driven to slide to the height of the swing gate valve by the second retractable rod, so that the cleaning component and the swing gate valve are in the same height range. Then, the dirt removing component is controlled to be moved along the horizontal direction through the micro pushing member, until the dirt removing component contacts the swing gate valve. Finally, the dirt removing component is controlled to be moved along the vertical direction through the sliding slot, so as to clean the swing gate valve.

Further, the gate valve device further includes a retractable carrier plate and a door. Therefore, in some embodiments, after the operation that through the second lifting component, the cleaning component is controlled to clean the swing gate valve, the cleaning method may further include the following operations.

The second lifting valve body is controlled to slide from the second vertical height to the first vertical height.

The dirt removing component and the retractable carrier plate are exposed by the door, so that the dirt removing component is replaced and/or the retractable carrier plate is cleaned.

The retractable carrier plate is configured to accommodate a part of dirt generated in a process of cleaning the swing gate valve by the cleaning component.

It should be noted that, in order to prevent the dirt generated in the cleaning process from affecting a subsequent production process, the retractable carrier plate is further provided below the dirt removing component, so that a part of the dirt generated in the cleaning process of the dirt removing component is collected by the retractable carrier plate. After the cleaning process, the second lifting valve body is returned to the first vertical height, and then the door at the gate valve device is opened, so that the dirt removing component is replaced, and/or the retractable carrier plate is cleaned.

Further, the gate valve device further includes an air pump component. Therefore, in some embodiments, the cleaning method may further include the following operations.

In the process of cleaning the swing gate valve by the cleaning component, a part of dirt generated in the cleaning process is extracted through the air pump component.

It should be noted that in the cleaning process, a sealed chamber is actually formed between the first lifting valve body and the swing gate valve, and an air pump may be provided for the sealed chamber. In this way, in the cleaning process, gas in the sealed chamber may be extracted by the air pump, so as to remove the dirt generated in the cleaning process.

It should also be noted that the overall gate valve device may be set to be manually or electrically controlled, preferably electrically controlled. In this case, considering the cleaning efficiency and safety, the force of the micro pushing member is less than or equal to a first threshold, and the signal response time of each of the first lifting component and the second lifting component is less than or equal to a second threshold. For example, the first threshold is 2 Newtons, and the second threshold is 1 second.

Figure 6:
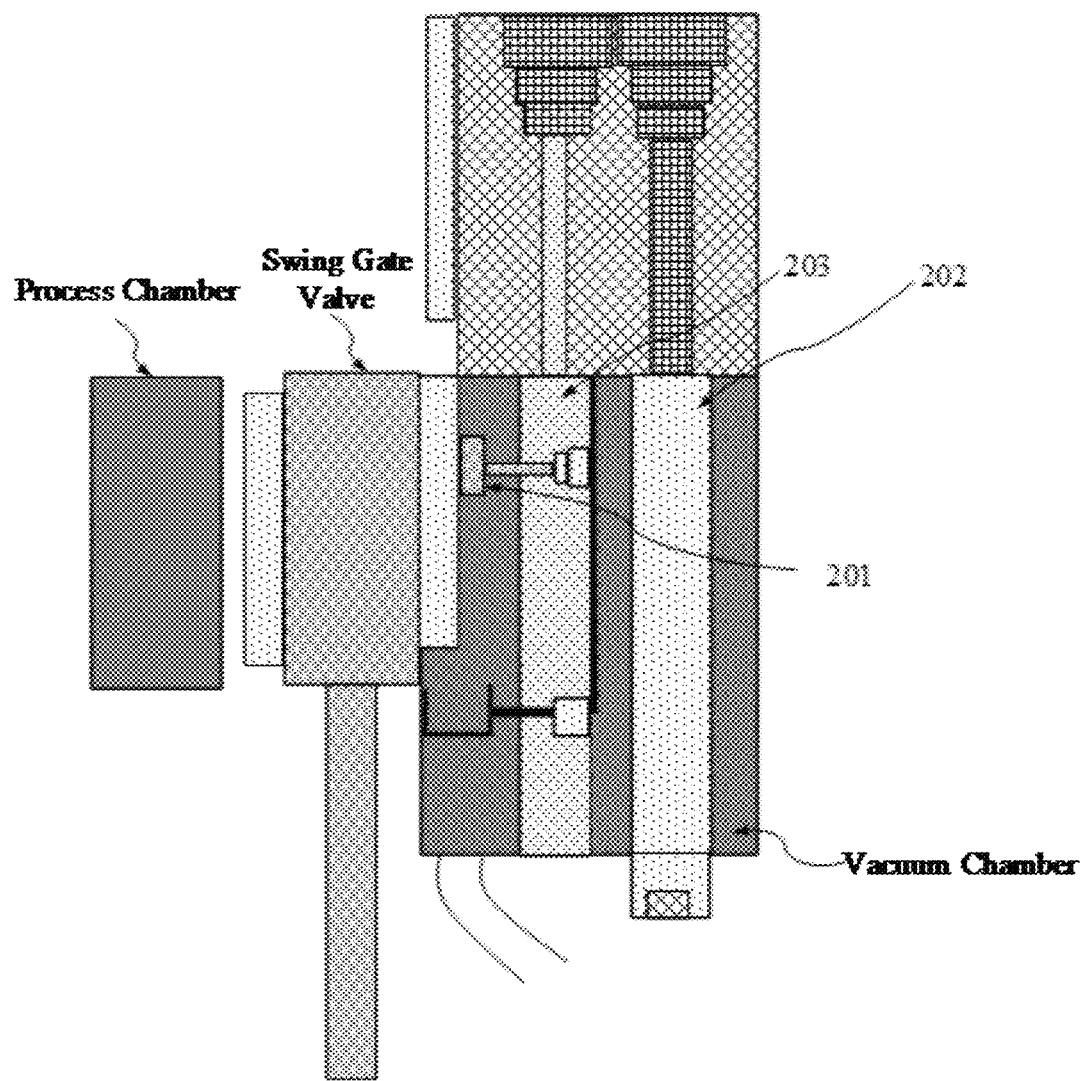
FIG. 6 is a diagram showing an application scene of a cleaning method according to an embodiment of the present disclosure.

Referring to FIG. 6, an application scene diagram of a cleaning method according to an embodiment of the present disclosure is shown. As shown in FIG. 6, the cleaning method is applied to a gate valve device. Specifically, FIG. 6 only shows a part of the vacuum chamber. The cleaning method includes the following operations.

In S100, during the maintenance of the process chamber, the first lifting component 202 is lowered to be closed, so as to isolate the vacuum on the side of the vacuum chamber.

In S200, the second lifting component 203 is lowered. The second lifting component 203 includes a cleaning component 201. The cleaning component 201 may include a micro pushing member and a hard sponge at the front end of the micro pushing member, a small sliding slot for assisting the sliding of the micro pushing member, and a retractable carrier plate.

In S300, when a gate valve in the second lifting component 203 is lowered, the retractable carrier plate is retraced below the swing gate valve, and then the micro pushing member is retracted to the surface of the swing gate valve. Specifically, the micro pushing member may control the magnitude of the force. After the hard sponge at the front end of the micro pushing member contacts the surface of the swing gate valve, the hard sponge is controlled to slide up and down along the auxiliary small sliding slot to achieve a purpose of cleaning the surface of the swing gate valve.

In S400, deposits, namely dirt, on the swing gate valve falls into the retractable carrier plate, and adheres to the hard sponge, and the remaining trace deposits is extracted by a dry pump (not shown in the figure).

In S500, when cleaning is completed, the micro pushing member and the retractable carrier plate are returned into the second lifting component, and are lifted along with the second lifting component 203, so that the hard sponge is replaced or the retractable carrier plate is cleaned through the door.

In this way, since the gate valve device provided by the embodiment of the present disclosure may be regarded as an independent micro system with strong independence, so that the gate valve device may be cleaned and maintained at any time. The gate valve device does not need to be cleaned during the maintenance of the chamber or the whole machine.

The embodiment of the disclosure provides a cleaning method for a gate valve device. The gate valve device is installed in a mechanical apparatus including a vacuum chamber and a process chamber. A swing gate valve is provided between the vacuum chamber and the process chamber. The gate valve device is arranged at an opening on a side of the vacuum chamber close to the swing gate valve. The gate valve device includes a cleaning component, a first lifting component and a second lifting component. The cleaning component is arranged on the second lifting component. The method includes the following operations. Through the first lifting component, the opening on the side of the vacuum chamber close to the swing gate valve is controlled to be in a closed state. Through the second lifting component, the cleaning component is controlled to clean the swing gate valve. In this way, the vacuum on the side of the vacuum chamber may be isolated by the first lifting component, so that the swing gate valve may be cleaned during the operation of the apparatus, thereby avoiding the apparatus from being damaged due to frequent downtime. The swing gate valve may be automatically cleaned through the second lifting component without being removed, so that the cleaning efficiency is improved. In addition, since the swing gate valve may be conveniently cleaned through the gate valve device, the cleanliness of the product is improved, thereby improving the operation efficiency of the overall apparatus.

Figure 7:
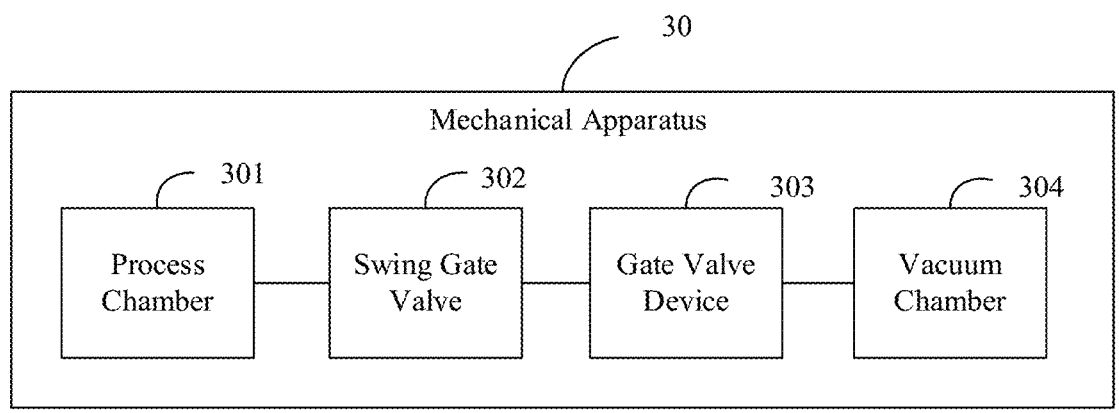
FIG. 7 is a schematic diagram of a mechanical apparatus according to an embodiment of the present disclosure.

In another embodiment, referring to FIG. 7, a schematic diagram of a mechanical apparatus 30 according to an embodiment of the present disclosure is shown. The mechanical apparatus 30 includes a vacuum chamber 304, a process chamber 301, a swing gate valve 302 and a gate valve device 303. The process chamber 301, the swing gate valve 302, the gate valve device 303 and the vacuum chamber 304 are sequentially arranged. The gate valve device 304 is the gate valve device described in any one of the above-mentioned embodiments, such as the gate valve device 20.

As shown in FIG. 7, for the mechanical apparatus 30, since it includes the gate valve device 303, the vacuum on the side of the vacuum chamber may be isolated by the first lifting component, so that the swing gate valve may be cleaned during the operation of the apparatus, thereby avoiding the apparatus from being damaged due to frequent downtime. The swing gate valve may be automatically cleaned through the second lifting component without being removed, so that the cleaning efficiency is improved. In addition, since the swing gate valve may be conveniently cleaned through the gate valve device, the cleanliness of the product is improved, thereby improving the operation efficiency of the overall apparatus.

In an embodiment, the mechanical apparatus 30 may be a semiconductor etching machine.

The above embodiments are only preferred embodiments of the present disclosure, and are not intended to limit the protection scope of the present disclosure.

It should be noted that in the present disclosure, terms "include", "comprise" or any other variants thereof are intended to cover non-exclusive inclusion, so that a process, a method, an article or a device including a series of elements not only includes those elements, but also includes those that are not explicitly listed, or also include elements inherent to the process, the method, the article, or the device. In the case that there are no more limitations, an element defined by the phrase "including a . . . " does not exclude the existence of other same elements in the process, the method, the article, or the device that includes the element.

The serial numbers of the above embodiments of the present disclosure are only for description, and do not represent the superiority or inferiority of the embodiments.

The methods disclosed in the several method embodiments provided in the present disclosure may be combined with each other arbitrarily without conflict, so as to obtain a new method embodiment.

The features disclosed in the several product embodiments provided in the present disclosure may be combined with each other arbitrarily without conflict, so as to obtain a new product embodiment.

The features disclosed in the several method or device embodiments provided in the present disclosure may be combined with each other arbitrarily without conflict, so as to obtain a new method embodiment or device embodiment.

The above are only specific embodiments of the present disclosure, but the protection scope of the present disclosure is not limited thereto. Any skilled in the art, within the technical scope disclosed by the present disclosure, may easily think of variations or replacements, which should be covered within the protection scope of the present disclosure. Therefore, the protection scope of the present disclosure should be subject to the protection scope of the claims.

What is claimed is:

1. A gate valve device, the gate valve device being installed in a mechanical apparatus comprising a vacuum chamber and a process chamber, a swing gate valve being provided between the vacuum chamber and the process chamber, and the gate valve device being arranged at an opening on a side of the vacuum chamber close to the swing gate valve;

the gate valve device comprising a cleaning component, a first lifting component and a second lifting component, and the cleaning component being arranged on the second lifting component, wherein the first lifting component is configured to control whether the opening on the side of the vacuum chamber close to the swing gate valve is in a closed state; and wherein the second lifting component is configured to, in a case that the opening on the side of the vacuum chamber close to the swing gate valve is in the closed state, control the cleaning component to clean the swing gate valve.

2. The gate valve device of claim 1, wherein the first lifting component comprises a first retractable rod and a first lifting valve body, and the first retractable rod is configured to drive the first lifting valve body to slide between a first vertical height and a second vertical height; and wherein the first lifting component is specifically configured to, in a case that the first lifting valve body slides to the first vertical height, control the opening on the side of the vacuum chamber close to the swing gate valve to be in an opened state; or the first lifting component is specifically configured to, in a case that the first lifting valve body slides to the second vertical height, control the opening on the side of the vacuum chamber close to the swing gate valve to be in the closed state.

3. The gate valve device of claim 2, wherein the gate valve device further comprises a safety pin and a safety slot, the safety pin is arranged on the first lifting valve body, and the safety slot is arranged at a bottom portion of the gate valve device; and wherein the safety pin is configured to, when the first lifting valve body slides to the second vertical height, be inserted into the safety slot to lock the first lifting valve body.

4. The gate valve device of claim 1, wherein the second lifting component comprises a second retractable rod and a second lifting valve body, and the cleaning component is arranged on the second lifting valve body; and wherein the second retractable rod is configured to drive the second lifting valve body to slide from a first vertical height to a second vertical height, so that the cleaning component and the swing gate valve are in a same height range.

5. The gate valve device of claim 4, wherein the cleaning component comprises a sliding slot, a micro pushing member and a dirt removing component, the sliding slot is arranged on the second lifting valve body, one end of the micro pushing member is arranged on the sliding slot, and another end of micro pushing member is provided with the dirt removing component;

wherein the micro pushing member is configured to control the dirt removing component to be moved along a horizontal direction, so that the dirt removing component contacts the swing gate valve; and wherein the sliding slot is configured to, in a case that the cleaning component contacts the swing gate valve, control the dirt removing component to be moved along a vertical direction to clean the swing gate valve.

6. The gate valve device of claim 5, wherein the cleaning component further comprises a retractable carrier plate, the retractable carrier plate is arranged on the second lifting valve body, and the retractable carrier plate is located below the dirt removing component; and wherein the retractable carrier plate is configured to accommodate a part of dirt generated in a process of cleaning the swing gate valve by the cleaning component.

7. The gate valve device of claim 6, wherein the gate valve device further comprises a door, wherein the second retractable rod is further configured to drive the second lifting valve body to slide from the second vertical height to the first vertical height, and wherein the door is configured to, in a case that the second lifting component slides to the first vertical height, expose the dirt removing component and the retractable carrier plate.

8. The gate valve device of claim 1, wherein the gate valve device further comprises an air pump component, the air pump component is configured to extract a part of dirt generated in a process of cleaning the swing gate valve by the cleaning component; and wherein the air pump component comprises an air pump, a switch valve and a filter screen, the air pump is connected to a closed chamber through a pipe, the switch valve and the filter screen are arranged at one end of the pipe close to the closed chamber, and the closed chamber is a chamber formed between the first lifting component and the swing gate valve in the case that the opening on the side of the vacuum chamber close to the swing gate valve is in the closed state.

9. A cleaning method for a gate valve device, the gate valve device being installed in a mechanical apparatus comprising a vacuum chamber and a process chamber, a swing gate valve being provided between the vacuum chamber and the process chamber, the gate valve device being arranged at an opening on a side of the vacuum chamber close to the swing gate valve, the gate valve device comprising a cleaning component, a first lifting component and a second lifting component, and the cleaning component being arranged on the second lifting component, the method comprising:

controlling, through the first lifting component, the opening on the side of the vacuum chamber close to the swing gate valve to be in a closed state; and controlling, through the second lifting component, the cleaning component to clean the swing gate valve.

10. The cleaning method of claim 9, wherein the first lifting component comprises a first retractable rod and a first lifting valve body, and wherein controlling, through the first lifting component, the opening on the side of the vacuum chamber close to the swing gate valve to be in the closed state comprises:

driving, by the first retractable rod, the first lifting valve body to slide from a first vertical height to a second vertical height to control the opening on the side of the vacuum chamber close to the swing gate valve to be in the closed state.

11. The cleaning method of claim 10, wherein the gate valve device further comprises a safety pin and a safety slot, and wherein the method further comprises:

inserting the safety pin into the safety slot to lock the first lifting valve body, when the first lifting valve body is driven by the first retractable rod to slide from the first vertical height to the second vertical height.

12. The cleaning method of claim 9, wherein the second lifting component comprises a second retractable rod and a second lifting valve body, and the cleaning component comprises a dirt removing component, a sliding slot and a micro pushing member; and wherein controlling, through the second lifting component, the cleaning component to clean the swing gate valve comprises:

driving, by the second retractable rod, the second lifting valve body to slide from a first vertical height to a second vertical height, so that the cleaning component and the swing gate valve are in a same height range;

controlling, through the micro pushing member, the dirt removing component to be moved along a horizontal direction, until the dirt removing component contacts the swing gate valve; and controlling, through the sliding slot, the dirt removing component to be moved along a vertical direction to clean the swing gate valve.

13. The cleaning method of claim 12, wherein the gate valve device further comprises a retractable carrier plate and a door; wherein the method, after controlling, through the second lifting component, the cleaning component to clean the swing gate valve, further comprises:

controlling the second lifting valve body to slide from the second vertical height to the first vertical height, and exposing the dirt removing component and the retractable carrier plate by the door, replacing the dirt removing component and/or cleaning the retractable carrier plate; and wherein the retractable carrier plate is configured to accommodate a part of dirt generated in a process of cleaning the swing gate valve by the cleaning component.

14. The cleaning method of claim 9, wherein the gate valve device further comprises an air pump component, and wherein the method, in a process of cleaning the swing gate valve by the cleaning component, further comprises:
   extracting, through the air pump component, a part of dirt generated in the process of cleaning the swing gate valve by the cleaning component.

15. A mechanical apparatus, comprising a vacuum chamber, a process chamber, a swing gate valve, and a gate valve device, the gate valve device being installed in the mechanical apparatus, the swing gate valve being provided between the vacuum chamber and the process chamber, and the gate valve device being arranged at an opening on a side of the vacuum chamber close to the swing gate valve;
   the gate valve device comprising a cleaning component, a first lifting component and a second lifting component, and the cleaning component being arranged on the second lifting component,
   wherein the first lifting component is configured to control whether the opening on the side of the vacuum chamber close to the swing gate valve is in a closed state; and
   wherein the second lifting component is configured to, in a case that the opening on the side of the vacuum chamber close to the swing gate valve is in the closed state, control the cleaning component to clean the swing gate valve.

* * * * *